United States Patent
Baklanov et al.

(10) Patent No.: US 8,540,890 B2
(45) Date of Patent: Sep. 24, 2013

(54) PROTECTIVE TREATMENT FOR POROUS MATERIALS

(71) Applicants: IMEC, Leuven (BE); GLOBALFOUNDRIES Inc., Grand Cayman (KY)

(72) Inventors: Mikhail Baklanov, Veltem-Beisem (BE); Francesca Iacopi, Leuven (BE); Serge Vanhaelemeersch, Leuven (BE)

(73) Assignees: IMEC, Leuven (BE); GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/675,442

(22) Filed: Nov. 13, 2012

(65) Prior Publication Data

US 2013/0119014 A1    May 16, 2013

(30) Foreign Application Priority Data

Nov. 15, 2011  (EP) .................................. 11189233

(51) Int. Cl.
    *B31D 3/00*        (2006.01)
(52) U.S. Cl.
    USPC .......................................................... 216/56

(58) Field of Classification Search
    USPC .......................................... 216/56; 438/689
    See application file for complete search history.

(56) References Cited

U.S. PATENT DOCUMENTS

2005/0148202 A1    7/2005  Heiliger et al.
2006/0027929 A1    2/2006  Cooney, III et al.

FOREIGN PATENT DOCUMENTS

EP         1637261 A1    3/2006

OTHER PUBLICATIONS

Frot et al. "Application of the Protection/Deprotection Strategy to the Science of Porous Materials", Adv. Mater., vol. 23, No. 25, 2011, pp. 2828-2832.

*Primary Examiner* — Roberts Culbert
(74) *Attorney, Agent, or Firm* — Knobbe, Martens, Olson & Bear, LLP.

(57) ABSTRACT

A method for treating a surface of a porous material in an environment is provided, comprising setting the temperature of the surface to a value T1 and setting the pressure of the environment to a value P1, contacting the surface with a fluid having a solidifying temperature at the pressure value P1 above the value T1 and having a vaporizing temperature at the pressure value P1 below 80° C., thereby solidifying the fluid in pores of the material, thereby sealing the pores, treating the surface, wherein the treatment is preferably an etching or a modification of the surface, and setting the temperature of the surface to a value T2 and setting the pressure of the environment to a value P2 in such a way as to vaporize the fluid.

22 Claims, 6 Drawing Sheets

PROTECTIVE TREATMENT FOR POROUS MATERIALS

CROSS-REFERENCE TO RELATED APPLICATION

This application claims the benefit of European Application No. 11189233.7 filed Nov. 15, 2011, the disclosure of which is hereby expressly incorporated by reference in its entirety and is hereby expressly made a portion of this application.

FIELD OF THE INVENTION

A method for protecting porous materials against damages upon etching or modification of a surface thereof is provided. The method is employed in the field of semiconductors devices and in the protection of low-k dielectric against plasma induced damages.

BACKGROUND OF THE INVENTION

When a porous substrate needs to be treated by etching or modification of a surface thereof, damage of the substrate often occurs. This is particularly true with plasma mediated treatments. This is presumably caused by active plasma radicals penetrating deeply into the porous substrate and reacting therewith, thereby changing its composition. Both oxidative and reductive plasma have such detrimental effects. This problem is well known to occur in the field of microelectronics during integration of low-k dielectrics.

Low-k dielectrics (materials having a dielectric constant lower than the dielectric constant of $SiO_2$, i.e. lower than 4.0) are necessary to decrease capacitance between nearby conductive portions of high density integrated circuits and thereby avoiding loss of speed and cross-talk. In order to decrease the dielectric constant of low-k dielectrics as much as possible, low-k dielectrics are made porous. Thereby, the dielectric constant can be lowered down to about 2.0 or even less. Integrated circuit fabrication processes on dielectrics involve plasma etching and expose therefore the dielectrics to the damages mentioned above. US2005/0148202 describes a method for sealing or protecting porous materials used in semiconductor fabrication. It describes sealing the pores of porous material by applying a mixture of a polymer compound and an organic solvent. The sealing layer thus formed is further dried resulting in evaporation of organic solvents and volatile constituent (if any), and securing of the polymer compound on the surface as a sealing material. Such a sealing method has however several drawbacks. The solvent used being in its liquid form when in contact with the substrate, and this for a large amount of time at a relatively high temperature, dissolution or damage of the porous layer is possible. Furthermore, the liquid solvent is susceptible to penetrate deeply in the porous material and part of it could remain entrapped below the dried polymer material, thereby changing the dielectric constant of the dielectrics.

Furthermore, the method is rather complicated, tedious and labour-intensive since it involves synthesising a particular polymer having well defined end-groups, preparing a particular polymer solution, applying it homogeneously on the substrate (this implies good wettability and elaborated application techniques), and heating the solution to evaporate solvent and/or dry the polymer. Furthermore, polymer deposition typically generates stresses in porous substrates. Also, the polymer being retained in the pores in the final product, it potentially influences the properties of the dielectrics making them harder to control. It also raises the question of mechanical stability when there is a mismatch between the thermal coefficient expansion of the polymer and of the porous material.

Dubois et al. (Adv. Mater. 2011, 23, 25, 2828-2832) discloses a similar method for sealing porous low-k dielectrics with an organic polymer. The polymer is degraded by thermal treatment once the etching and other processing steps are performed. This presumably permits the patterned dielectric in the final structure to have comparable properties to its pristine equivalent. However, removing a polymer by thermal means implies degrading it and thereby the possibility of leaving polymer residues in the pores. Also, it is energy intensive. Furthermore, the other drawbacks proper to the use of polymers remain as mentioned above for US2005/0148202.

There is therefore a need in the art for a way to prevent damages to porous substrates upon plasma treatment, which avoids the above drawbacks.

SUMMARY OF THE INVENTION

A method which permits the treatment of a porous material surface while protecting this surface from excessive damages is provided.

In a first aspect, a method for treating a surface of a porous material in an environment is provided, the method comprising the steps of:
I. Setting the temperature of the surface to a value T1 and setting the pressure of the environment to a value P1,
II. contacting the surface with a fluid having a solidifying temperature at the pressure value P1 above the value T1 and having a vaporizing temperature at the pressure value P1 below 80° C., thereby solidifying the fluid in pores of the material, thereby sealing the pores,
III. treating the surface, wherein the treatment is preferably an etching or a modification of the surface,
IV. Setting the temperature of the surface to a value T2 and setting the pressure of the environment to a value P2 in such a way as to vaporize the fluid,
Wherein:
  step i precedes step ii, step ii precedes step iii, and step iii precedes step iv, or
  step i precedes step ii, step ii overlaps or is simultaneous with step iii, and step iii precedes step iv, or
  step ii precedes step i, step i precedes step iii, and step iii precedes step iv.
  In an embodiment, treating the surface may be contacting the surface with a plasma.
  In embodiments of the first aspect, the value T2 may be at least equal to the vaporization temperature of the fluid at the pressure value P1 and wherein the value P2 is the value P1.
  In embodiments of the first aspect, the material may have a dielectric constant lower than 3.9, preferably lower than 3.5, more preferably lower than 3.0 and most preferably lower than 2.4. The method of embodiments of the present invention is advantageously applied to such low-k materials, in particular prior to plasma treatment (e.g. etching). The use of plasma etching on such low-k materials has been shown in the prior art to cause damages and embodiments of the present invention help to prevent such damages.
  In embodiments of the first aspect, the porous material may be a nanoporous material.

In embodiments of the first aspect, the porosity of the porous material may be interconnected (at least partly interconnected, preferably fully interconnected). When the porous material is interconnected, the method of the present invention permits to very efficiently fill all pores of the surface or material with fluid, thereby assuring that e.g. during the etching of a cavity in the material, all walls of the cavity are sealed with the solidified solid.

In embodiments of the first aspect, the material may be a silicon-containing material or a porous organic polymer.

In embodiments of the first aspect, the value T1 may be below 0° C., preferably below −5° C.

In embodiments of the first aspect, the treatment may be any treatment susceptible to damage the porous material.

In embodiments of the first aspect, the treatment may be a plasma treatment, preferably a plasma etching. Embodiments of the present invention advantageously prevent plasma-induced damages. It is an advantage of embodiments of the present invention that, due to the diffusion of the fluid in the pores, the protection of the pores toward the treatment extends to a certain depth below the surface of the porous material. This permits to create recesses via etching in the porous material while benefiting from the protective effect of the solidified fluid during the whole etching process.

In embodiments of the first aspect, the fluid may be an inorganic fluid or an organic fluid. Examples of suitable inorganic fluids are Xe, $CO_2$, $NH_3$, $H_2O$ and $SF_6$. Examples of suitable organic fluids are hydrocarbons and halocarbons.

In an embodiment, the fluid may have a melting point at 1 atm lower than 10° C.

In embodiments of the first aspect, the step (i) may be performed by placing the material in thermal contact with a bearing having its temperature at the value T1 in such a way that the surface faces away from the bearing. This is advantageous as controlling the temperature of the bearing is more efficient for controlling the temperature of the porous material surface than controlling the temperature of the entire environment (e.g. a cryogenic chamber).

In embodiments of the first aspect, the value T2 may be in the range 15° C.-80° C.

In embodiments of the first aspect, the treatment may be an etching of the surface so as to form a recess (e.g. a trench). In embodiments, the method further comprises the steps of:

V. filling at least partially the recess with a metal, wherein step v is performed after step iii and before or after step iv. This is advantageous since the sealed pores of the recess walls prevent penetration of the metal in the pores.

In embodiments, optionally no hard mask is used prior to form the recess.

In embodiments of the first aspect, the method of anyone of the above embodiments may further comprises: before step i, VI. Providing a porous material having a surface bearing a resist layer, and VII. Patterning the resist layer so as to expose a surface of the porous material,
thereby providing the surface of the porous material,
wherein the treatment of the surface is an etching of the surface, thereby forming a recess in the porous material.

In a second aspect, a device comprising a treated porous material obtainable by a method as described herein is provided.

In a third aspect, a device comprising a porous material is provided, the porous material having trenches in a surface thereof, the porous material having a k-value lower than 2.5 at the level of the trenches, preferably lower than 2.3.

Up to now, low-k materials having a k-value lower than 2.5 in which trenches have been subsequently etched show k-values at the level of the trenches rising above 3. This is due to plasma-induced damages.

Particular and preferred aspects of the invention are set out in the accompanying independent and dependent claims. Features from the dependent claims may be combined with features of the independent claims and with features of other dependent claims as appropriate and not merely as explicitly set out in the claims.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

Figure 1:
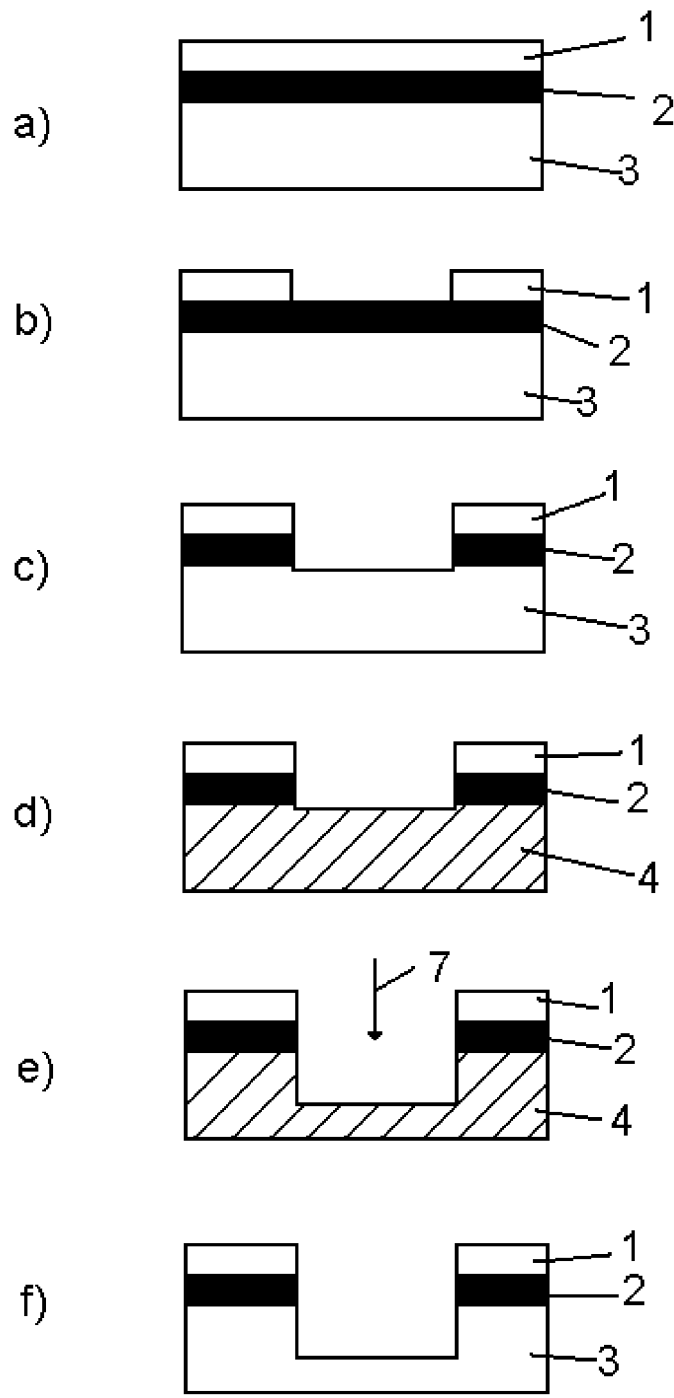
FIG. 1 is a diagrammatic illustration of a process according to an embodiment.

In the different figures, the same reference signs refer to the same or analogous elements.

DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms "first", "second", "third" and the like, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms "top", "bottom", "over", "under" and the like are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

The following terms are provided solely to aid in the understanding of the invention.

As used herein and unless provided otherwise the term "solidifying temperature at a pressure P" refers to either the freezing temperature at the pressure P if the fluid is a liquid or the deposition (desublimation or phase transition from gas to solid) temperature at the pressure P if the fluid is a gas.

As used herein and unless provided otherwise the term "vaporizing temperature at a pressure P" refers to either the boiling point at the pressure P if the fluid is a liquid or the sublimation temperature at the pressure P if the fluid is a gas.

In a first aspect, a method for treating a surface of a porous material in an environment is provided, the method comprising the steps of:

I. Setting the temperature of the surface to a value $T1$ and setting the pressure of the environment to a value $P1$, II. contacting the surface with a fluid having a solidifying temperature at the pressure value $P1$ above the value $T1$ and having a vaporizing temperature at the pressure value $P1$ below 80° C., thereby solidifying the fluid in pores of the material, thereby sealing the pores, III. treating the surface, wherein the treatment is an etching or a modification of the surface, IV. Setting the temperature of the surface to a value $T2$ and setting the pressure of the environment to a value $P2$ in such a way as to vaporize the fluid, wherein either:

step i precedes step ii, step ii precedes step iii, and step iii precedes step iv, or step i precedes step ii, step ii overlaps or is simultaneous with step iii, and step iii precedes step iv, or step ii precedes step i, step i precedes step iii, and step iii precedes step iv.

The porous material may be any porous material. The material can for instance take the form of a layer supported on a substrate or can be self-supported.

The porous material may for instance be a nanoporous material, i.e. a material which pores have on average a diameter comprised between 0.2 and 1000 nm, or may be a material which pores have on average a diameter equal to or larger than 1 µm. Preferably, the porous material is a nanoporous material.

Nanoporous materials can be subdivided into 3 categories, the macroporous materials, the mesoporous materials and the microporous materials.

Macroporosity refers to pores greater than or equal to 50 nm and smaller than 1000 nm in diameter.

Mesoporosity refers to pores greater than or equal to 2 nm and smaller than 50 nm in diameter.

Microporosity refers to pores greater than 0.2 nm and smaller than 2 nm in diameter.

The embodiments can be used with nanoporous materials belonging to any of these three categories. However, an important family of materials for which the method according to embodiments is particularly useful is mesoporous materials and in particular mesoporous low-k materials, in particular those with a pore size comprised between 2 and 10 nm.

These materials have repeatedly been demonstrated to suffer from plasma induced damage, making their etching an ongoing challenge that embodiments help to meet.

The porous material is preferably a porous low-k material.

In an embodiment, the material may have a dielectric constant lower than 3.9, preferably lower than 3.5, more preferably lower than 3.0 and most preferably lower than 2.4.

In one embodiment, the porosity of the porous material is interconnected (or open).

For instance it can be at least partly interconnected, preferably fully interconnected.

Interconnected pores are advantageous because chemically stable fluids like toluene (amongst others) can fill them all.

A material having a fully interconnected porosity is advantageous because chemically stable fluids like toluene (amongst others) can fill all pores of a 1 µm thick material film in 2 minutes or less by contacting its top surface (the top surface is free, i.e. has no hard mask, resist or else thereon).

In certain embodiments, the porous material may have a porosity of 10% or more, preferably 20% or more, more preferably 30% or more and most preferably 40% or more. In certain embodiments, the porous material may have a porosity of 80% or less. A porosity of 10% means that the pores amounts for 10% of the volume of the porous material. A greater porosity is advantageous as it increases the speed of diffusion of the fluid in the porous material. It therefore shortens the contacting step of the method and increases its efficiency.

In an embodiment, the thickness of the porous material is 600 nm or less, preferably 400 nm or less, most preferably 300 nm or less. Certain embodiments permit to fill the pores of a 200 nm layer in only a few seconds.

In certain embodiments, the material may be a porous silicon-containing material or a porous organic polymer.

Porous silicon-containing materials include, for example, silica aerogels, silica xerogels, silsesquioxanes including hydrisosilsesquioxane (HSQ) and methylsilsesquioxane (MSSQ), silicalite-based films, dendrite-based porous glass, mesoporous silica, and porous carbon-doped silicon dioxides (i.e. organosilicates) amongst others.

Porous organic polymers include porous polyarylene ethers, porous thermosetting polyarylene ethers, and porous aromatic thermosetting resins such as SiLK™ (a semiconductor dielectric supplied by The Dow Chemical Company®) amongst others.

In one embodiment, the porous material (e.g. a low-k material) is prepared as follow before to perform the temperature and pressure setting step and the contacting step:

a surface of the porous material is optionally provided with a hard mask (e.g. comprising TaN, TiN, SiN, or amorphous carbon) covering the surface, the hard mask (if present) or a surface of the porous material (if no hard mask is present) is provided with a resist covering the hard mask (if present) or the surface of the porous material (if no hard mask is present), openings are performed in the resist, if a hard mask is present, openings are performed in the hard mask by etching through the openings in the resist. The plasma can for instance be a F-containing plasma. In embodiments, the plasma etching can be done at the temperature T1 and pressure P1. The result is a porous material having an exposed surface.

In this embodiment, the treatment of the surface is preferably a plasma etching treatment. FIGS. 1-7 and their corresponding description exemplify such embodiments.

The environment can be any environment but is typically a chamber (e.g. comprising a bearing for the porous material). Preferably it is a chamber which temperature can be set below room temperature and/or which pressure can be set below 1 atm. A cryogenic chamber for plasma treatment is a typical example. Instead of setting the whole chamber to temperature T1, a bearing within this chamber can be set at the temperature T1.

In certain embodiments, setting the temperature or pressure can be performed actively or passively. Setting the temperature or pressure passively is simply using the temperature or pressure of the environment, without increasing or decreasing it to a target temperature or pressure and without performing particular acts to maintain it. Typically, setting the temperature or pressure passively will be performed by choosing an environment having the wished temperature or pressure. Setting the temperature or pressure actively implies increasing or decreasing the temperature or pressure of the environment to a target value or value range and maintaining the temperature or pressure at this value or within this range.

Both types of setting can be used with the various embodiments.

In certain embodiments, the fluid can be a gas or a liquid which is solid or solidifies at temperature T1 and pressure P1. It is preferably a gas which is solid or solidifies at temperature T1 and pressure P1.

The contact between the surface and the fluid can be operated by introducing the fluid directly as such in the environment where the porous material is or by producing the fluid in situ within this environment. In the latter case, the fluid can for instance be a product of the interaction of a plasma with the porous material or with another material present in the environment (e.g. another layer of a device comprising the porous material or a gas present in the environment). An example of a fluid produced from the interaction of a plasma and the porous material is a fluid of chemical formula $SiO_xF_y$, resulting from the interaction of a $SF_6/O_2$ plasma with a porous silicon containing material.

Another example is the fluid $H_2O$ produced upon interaction between an oxygen plasma and an organosilicate resist layer comprised in a device comprising the porous material.

In one embodiment, the fluid is introduced directly as such in the environment.

The fluid can be inorganic or organic. Examples of suitable inorganic fluids are Xe, $CO_2$, $NH_3$ and $SF_6$ ($SF_6$ has a melting temperature of −50.8° C. at atmospheric pressure). H2O can also be used but is less preferred.

Examples of suitable organic fluids are hydrocarbons and halocarbons.

Examples of suitable halocarbons are fluorocarbons having a fluorine to carbon ratio of two such as $C_2F_4$ or $C_4F_8$.

Particularly well suited fluids have a melting point at atmospheric pressure lower than 10° C., preferably lower than 5° C., more preferably lower than 0° C. and most preferably lower than −5° C. The melting point of these fluids is preferably higher than −130° C., more preferably higher than −100° C. Practical examples of such fluids are toluene, $C_6$-$C_{12}$ alkanes and octafluorocyclobutane ($C_4F_8$), Xe, $CO_2$, $SF_6$ and $NH_3$. $H_2O$ having the property to dilate upon freezing, it is less preferred.

In an embodiment, when the treatment step is an etching step, the contacting step between the surface of the porous material and the fluid may lead to the fluid diffusing within the porous material down to a depth at least equal to the depth of the recess that will be etched in the material during the etching step. This vertical diffusion is advantageous as it permits the porous material to have its pores filled down to the depth. The contacting of the surface of the porous material and the fluid also usually leads to lateral diffusion under the mask (resist or hard mask). This vertical and/or lateral diffusion protects the pores of the recess walls during the entire etching process. This has a clear advantage over simply sealing the surface of the substrate with a coating not penetrating in the porous material. Indeed, the protection conferred by a simple not penetrating coating does not extend to the walls of the recesses being created.

The vaporization temperature of the fluid is preferably below 80° C. at the pressure P1 at which the contacting step between the surface and the fluid is operated. This is advantageous as it permits to vaporize the fluid after the treatment and therefore restore the porosity of the material with a relatively low energetic budget.

In certain embodiments, the temperature T1 may be below room temperature. Preferably, T1 is below 10° C. and is more preferably below 0° C. and most preferably below −5° C.

There is no theoretical lower limit for T1 but for economic reasons, it is usually not necessary to use T1 temperature lower than −130° C. Preferably, T1 is above −100° C.

There is no real restriction on the pressure value P1 as long as a fluid can be found which can be solidified at P1. Positive pressure, atmospheric pressure or vacuum are therefore all possible.

In certain embodiments, the pressure P1 can be anywhere between atmospheric pressure and a lower pressure. Preferably, P1 may be from 1 to 200 mtorr and most preferably from 5 to 50 mtorr (about from $6.5\ 10^{-3}$ to $6.6\ 10^{-2}$ atm).

The treatment of the surface may be an etching of the surface, a modification of the surface, or a combination of both. It can also be an etching or a modification of a structure (e.g. a resist layer) present on the surface.

Although the treatment is operated on the surface, it can also have effects in the bulk of the material. For instance, the etching of the surface may create trenches extending within the bulk.

The etching of the surface can be any kind of etching. For instance it can be an isotropic etching, an anisotropic etching or a combination of both. It can be a chemical etching, a physical etching or a combination of both.

In an embodiment, the modification of the surface may be a coating of the surface. For instance it can comprise creating a layer of a second material on the porous material or it can comprise plasma treating the surface to change it properties. For instance it can involve changing the hydrophilicity of the surface, cleaning the surface or forming functional groups on the surface. For instance coating a low-k porous material with a metal such as gold is in some cases promoted by the treatment of the low-k porous material substrate with a plasma. This process is for instance use in the preparation of substrates for plasmon resonance measurements.

In one embodiment, the treatment is a plasma treatment such as for instance a plasma etching, a plasma surface modification or a plasma enhanced deposition. It is noteworthy that a plasma treatment aimed at a structure present on the surface will also lead to a contact between the plasma and the surface. This is also encompassed as an etching or a modification of the surface The solidification of the fluid in pores of the material is preferably the result of a process wherein the fluid enters and at least partly fills the pores, then solidifies within the pores, thereby sealing the pores.

In certain embodiments, the temperature T2 and the pressure P2 are set so as to enable the vaporization of the fluid.

In certain embodiments, T2 may be at least equal to the vaporization temperature of the fluid at the pressure value P1.

In certain embodiments, the temperature T2 may be 15° C. or higher. Preferably, it may be in the range 15° C.-80° C. Preferably, T2 is room temperature, i.e. typically a temperature ranging from 20 to 25° C.

In certain embodiments, the value P2 is equal or is higher than the pressure P1.

In certain embodiments, the value P2 may be the value P1. In other embodiments, P2 may be atmospheric pressure.

In an embodiment, step i may precede step ii, step ii may precede step iii, and step iii may precede step iv.

By performing step i before step ii, the solidification operates faster and its extent in the material is smaller. This permits to optimize the processing speed.

By performing step ii before step iii, the amount of damage to the material is minimized since the treatment is performed only when all pores susceptible to be damaged by it are filled and sealed.

In an embodiment, step i may precede step ii, step ii may overlap or may be simultaneous with step iii, and step iii may precede step iv.

When step ii overlaps step iii, it is preferred that step ii starts simultaneously with step iii or starts before step iii. The reason for this is that if step iii is started before step ii, the surface will be treated in its unsealed (and therefore unprotected) form for a time equivalent to the delay between the start of step iii and the start of step ii. Nevertheless, the embodiment where step iii is started before step ii benefits from the protective effect conferred by the embodiments for the entirety of the overlap period and for any period following the stop of step ii if step iii is still operating.

Overlapping step ii and step iii can either be inherent to the fluid chosen for contacting the surface or can be a deliberate choice not imposed by the chosen fluid.

An example where step ii and iii may overlap is when an $SF_6/O_2$ plasma is used during the etching of a surface of a Si-containing porous material, there the $SiO_xF_y$ fluid produced in situ is effectively produced simultaneously with the plasma etching.

When the fluid is directly entered as such in the environment containing the porous material, the choice of having step ii overlapping with step iii or not is deliberate.

In one embodiment, the fluid is introduced as such in the environment, e.g. via an inlet in a treatment chamber. This permits to perform step ii before step iii which is advantageous to minimize damages to the porous material.

Embodiments where step ii overlaps or is simultaneous with step iii is particularly advantageous when the porous substrate has pores larger than 1 μm, since for smaller pores, diffusion reduces somewhat the protective effect that can be obtained.

In an embodiment, step ii may precede step i, step i may precede step iii, and step iii may precede step iv. This embodiment is typically performed with the fluid being directly entered as such in the environment. The advantage to perform step ii before step i is that time is given for the fluid to impregnate a larger part or the entirety of the porous material before to solidify. This leads to a more complete and more homogeneous filling of the pores, leading to a better protective effect. This method, although more time consuming than the method where step i is performed before step ii, can nevertheless be performed in an efficient way without excessive time loss. For instance, this can be achieved by placing the porous material on a bearing having retractable pins as described below. This embodiment is particularly suited to nanoporous materials in comparison to materials having pores larger than 1 μm in diameters. This is due to the relatively slower diffusion of the fluid in nanoporous materials, making the other steps order less efficient.

In certain embodiments, the porous material may be placed in the environment on a bearing. In the field of semiconductor processing, the bearing is typically a chuck. The bearing can be set at temperature T1 and step i can be performed by placing the porous material in thermal contact with the bearing having its temperature at the value T1 in such a way that the surface faces away from the bearing.

In certain embodiments, the bearing may have retractable pins. This is advantageous as it permits the porous substrate to be 1) placed in the environment where the treatment is to be performed, without cooling it down to the solidification temperature of the fluid at the pressure of the environment, 2) contacting a surface of the substrate with the fluid at a temperature above its solidification temperature at the pressure of the environment (this permits a good impregnation of the porous material with the fluid), and 3) lowering the substrate on the bearing by retracting its pins, thereby establishing a good thermal contact between the bearing and the substrate and thereby lowering the temperature of the surface to the temperature T1.

In a second aspect, a device comprising a treated porous material according to a method as described herein is provided.

In a third aspect, a device is provided comprising a porous material, the porous material having trenches in a surface thereof, the porous material having a k-value lower than 2.5, preferably lower than 2.3.

In an embodiment, the k-value exists at the level of the trenches.

The invention will now be described by a detailed description of several embodiments of the invention. It is clear that other embodiments of the invention can be configured according to the knowledge of persons skilled in the art without departing from the technical teaching of the invention, the invention being limited only by the terms of the appended claims.

Referring to FIG. 1:

FIG. 1 illustrates an embodiment where the pores of a porous substrate are filled and thereby sealed before treating (here etching) the surface of the porous substrate.

In step (a), a multilayer is provided comprising a porous low-k material 3. A hard mask 2 is provided on the porous low-k material 3 and a resist layer 1 is provided on the hard mask 2 by standard lithographic techniques. The hard mask 2 can for instance be made of TaN, TiN, SiN or amorphous carbon.

In step (b), an opening is performed in the resist layer 1 by a standard lithographic technique (for instance involving fluorocarbons), thereby making accessible a surface of the hard mask 2.

In step (c) the opened multilayer is transferred to a cryogenic chamber under a reduced pressure P1 and is positioned on a bearing (a chunk) having a temperature T1 lower than the temperature at which the fluid freezes under the pressure conditions of the chamber. The hard mask is then etched by fluorine containing plasma, thereby making accessible a surface of the porous material 3.

In step (d), the chamber is filled with the fluid, which penetrates the pores of the substrate and freezes within, thereby providing a filled substrate 4.

In step (e), the filled substrate 4 is then etched with a fluorine containing plasma 7 down to the appropriate depth.

In step (f), the plasma treatment is then stopped, the pressure is allowed to increase back to a pressure P2 of e.g. 1 atm and the temperature is allow to increase back to a temperature T2 equal to e.g. room temperature. The result of this exemplary embodiment is a patterned porous low-k substrate which is not damaged.

Figure 2:
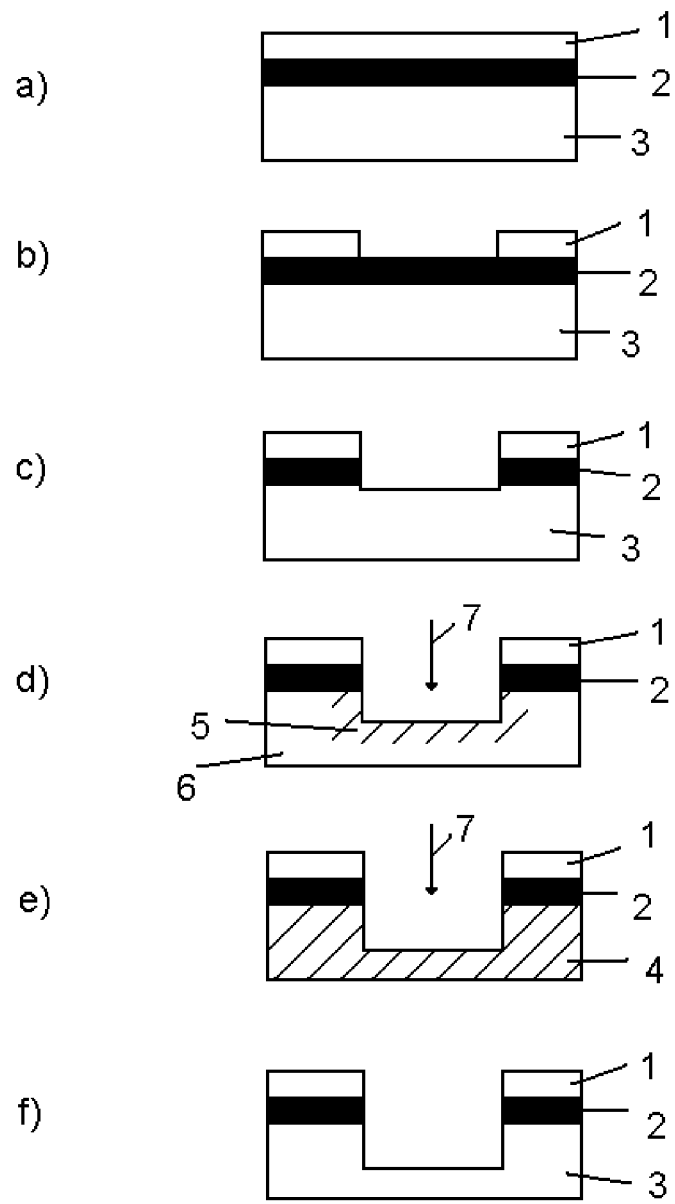
FIG. 2 is a diagrammatic illustration of a process according to another embodiment.

Referring to FIG. 2:

FIG. 2 illustrates an embodiment where the pores of a porous substrate are filled and thereby sealed during the treatment (here etching) of the surface of the porous substrate.

In step (a), a multilayer is provided comprising a porous low-k silicon material 3. A hard mask 2 is provided on the porous low-k material 3 and a resist layer 1 is provided on the hard mask 2 by standard lithographic techniques. The hard mask 2 can for instance be made of TaN, TiN, SiN or amorphous carbon.

In step (b), an opening is performed in the resist layer 1 by a standard lithographic technique, thereby making accessible a surface of the hard mask 2.

In step (c) the opened multilayer is transferred to a cryogenic chamber under a reduced pressure P1 and is positioned on a bearing (a chunk) having a temperature T1 lower than the temperature at which the fluid freezes under the pressure conditions of the chamber. The hard mask is then etched by fluorine containing plasma, thereby making accessible a surface of the porous substrate 3.

In step (d), the chamber is filled with a fluorine containing plasma (e.g. $SF_6$) and oxygen. The plasma is ignited and etching 7 starts. Upon reaction between the fluorine containing plasma, the oxygen and the surface of the porous low-k silicon substrate, a $SiO_xF_y$ fluid is formed. Step (d) shows how a filled zone 5 develops during the etching while the fluid penetrates the pores of the substrate and freezes within. A not-yet filled zone 6 is also depicted.

In step (e), etching is continued down to the appropriate depth.

In step (f), the plasma treatment is then stopped, the pressure is allowed to increase back to a pressure P2 of e.g. 1 atm and the temperature is allow to increase back to a temperature T2 equal to e.g. room temperature. The result of this exemplary embodiment is a patterned porous low-k substrate which is not damaged.

Figure 3:
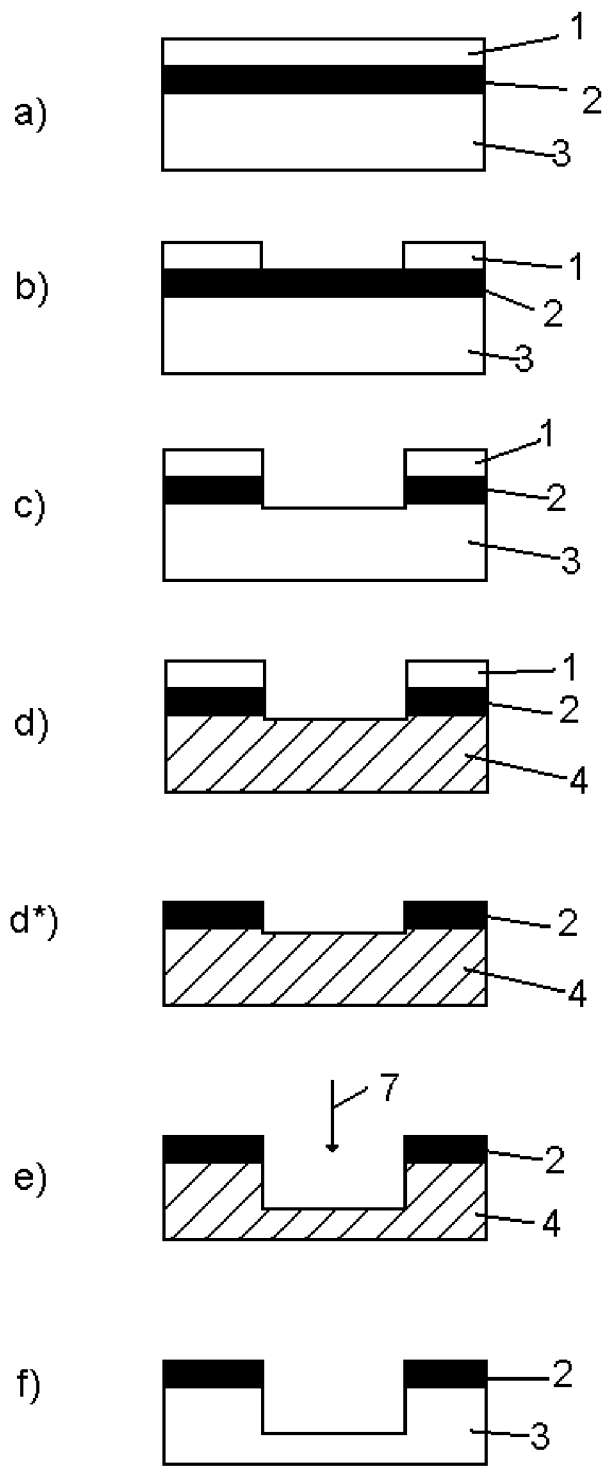
FIG. 3 is a diagrammatic illustration of a process according to yet another embodiment.

Referring to FIG. 3:

FIG. 3 illustrates an embodiment similar to FIG. 1 where the pores of a porous substrate are filled and thereby sealed before treating (here removing the resist and etching) the surface of the porous substrate. However, in this embodiment, the resist layer is stripped in situ during a step (d*) after that the pores of the substrate have been filled. The stripping step uses oxygen or hydrogen plasma which is a source of damage for the porous substrate. Performing the stripping step after that the pores of the substrate have been filled has therefore the advantage of avoiding damaging the porous substrate during the resist removal step.

Figure 4:
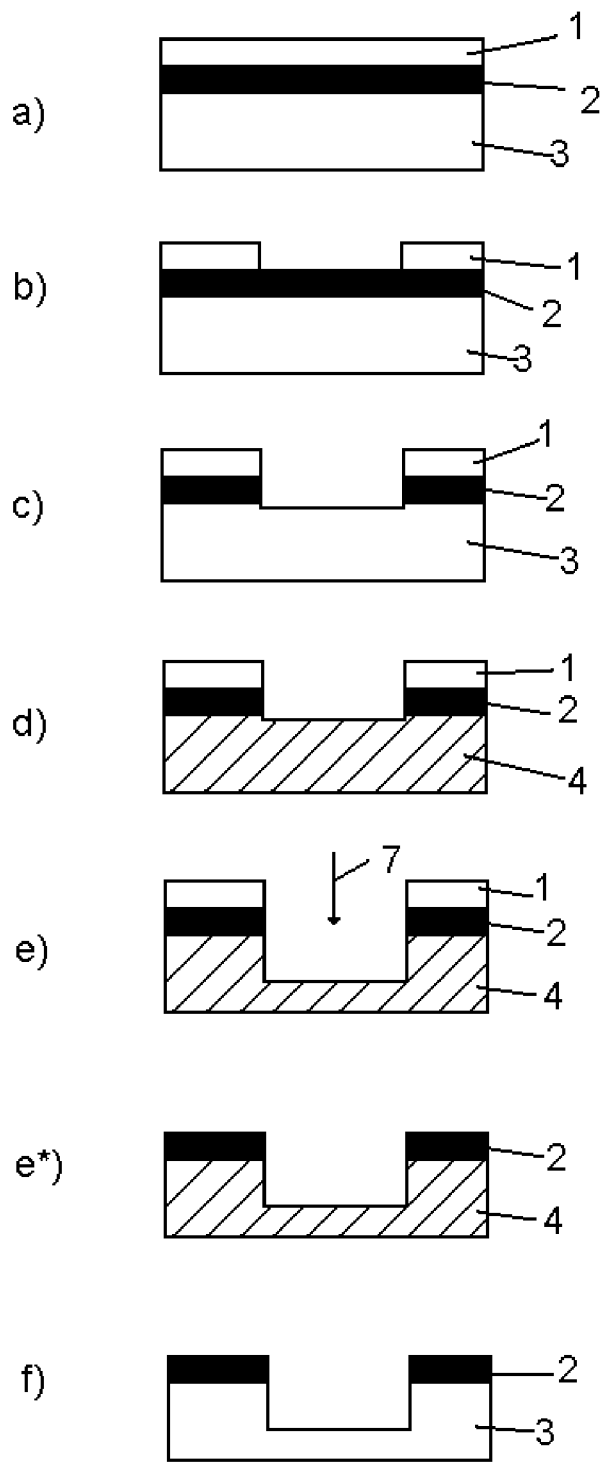
FIG. 4 is a diagrammatic illustration of a process according to yet another embodiment.

Referring to FIG. 4:

FIG. 4 illustrates an embodiment similar to FIG. 3 where the pores of a porous substrate are filled and thereby sealed before treating (here etching) the surface of the porous substrate. However, in this embodiment, the resist layer is stripped in situ during a step (e*) after that the pores of the substrate have been filled and after the filled substrate 4 has been etched with a fluorine containing plasma 7 down to the appropriate depth. The advantages are the same as for the embodiment of FIG. 4, i.e. avoiding damaging the porous substrate during the resist removal step.

Figure 5:
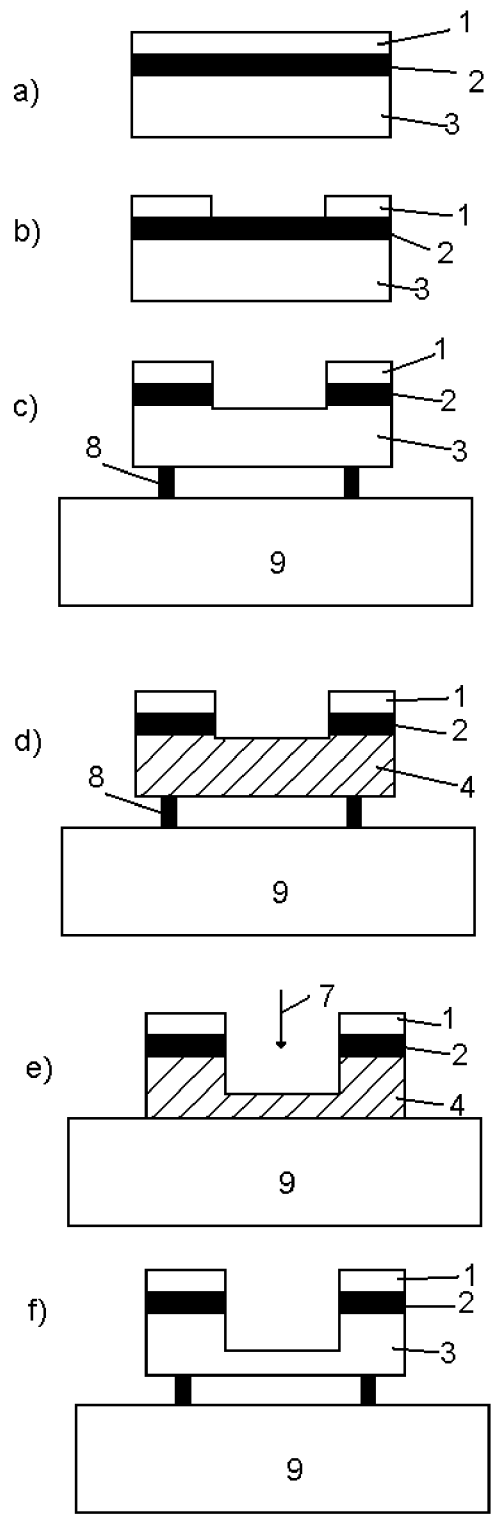
FIG. 5 is a diagrammatic illustration of a process according to yet another embodiment.

Referring to FIG. 5:

FIG. 5 shows a variant applicable to the embodiments of FIG. 1. In FIG. 5, steps (a) and (b) are identical to the steps described in FIG. 1.

In step (a), a multilayer is provided comprising a porous low-k material 3. A hard mask 2 is provided on the porous low-k material 3 and a resist layer 1 is provided on the hard mask 2 by standard lithographic techniques. The hard mask 2 can for instance be made of TaN, TiN, SiN or amorphous carbon.

In step (b), an opening is performed in the resist layer 1 by a standard lithographic technique, thereby making accessible a surface of the hard mask 2.

In step (c) the opened multilayer is transferred to a cryogenic chamber under a reduced pressure P1 and is positioned on retractable pins of a bearing (a chunk) having a temperature T1 lower than the temperature at which the fluid freezes under the pressure conditions of the chamber. The hard mask 2 is then etched by fluorine containing plasma. Due to the presence of the pins 8, there is a certain distance between the material 3 and the cooled bearing 9, assuring that the temperature of the material 3 remains above T1 and above the temperature at with the fluid freezes under the pressure conditions of the chamber.

In step (d), the chamber is filled with the fluid, which penetrates the pores of the material 3 without freezing, thereby providing a filled substrate 4.

In step (e), the filled substrate 4 is lowered against the cooled bearing 9, thereby establishing thermal contact between the filled substrate 4 and the cooled bearing 9, thereby permitting the freezing of the fluid within the pores of the substrate. The filled substrate 4 is then etched with a fluorine containing plasma 7 down to the appropriate depth.

In step (f), the plasma treatment is then stopped, the pressure is allowed to increase back to a pressure P2 of 1 atm and the temperature is allow to increase back to a temperature T2 equal to room temperature. This raising of the temperature is made faster by lifting the substrate away from the bearing. The result of this exemplary embodiment is a patterned porous low-k substrate which is not damaged. An advantage of using the retractable pins 8, is that the filling of the pores with the fluid is more complete and homogeneous as no fluid freezes before that the porous substrate is entirely filled with the fluid.

Figure 6:
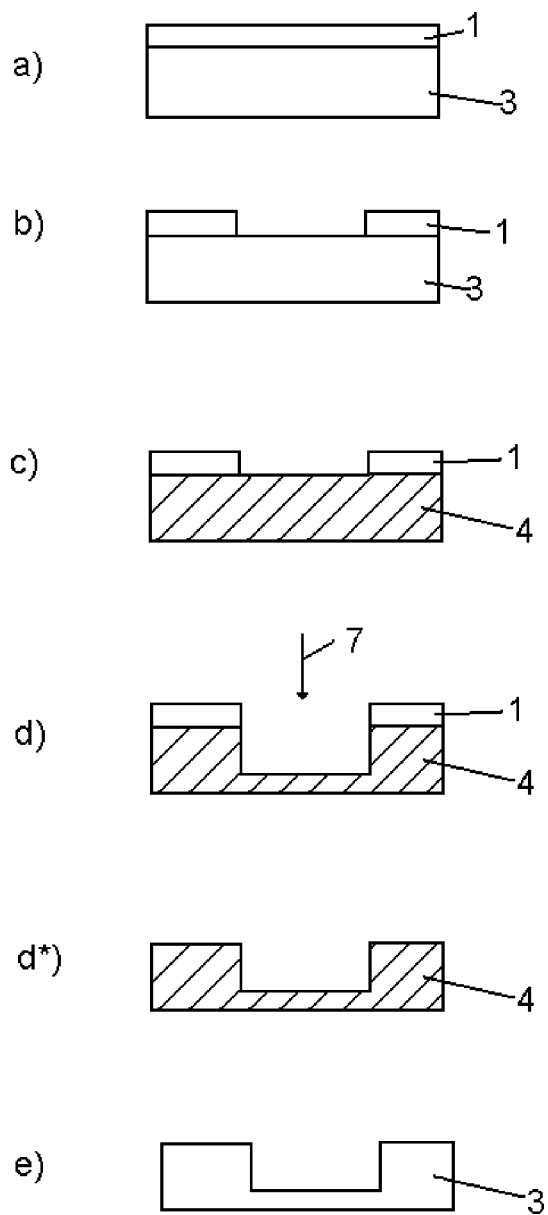
FIG. 6 is a diagrammatic illustration of a process according to yet another embodiment.

Referring to FIG. 6:

FIG. 6 illustrates a particularly advantageous embodiment. It is similar to FIG. 4 where the pores of a porous substrate are filled and thereby sealed before treating (here etching) the surface of the porous substrate. However, in this embodiment, no hard mask layer is used. A hard mask is typically used to avoid low-k damage during the resist strip in $O_2$ and $H_2$ plasma. In the embodiment of FIG. 6, no hard mask is needed anymore because of ability to strip the resist without damaging the low-k material. This is a big advantage because normally the hard mask generates stress which is one of the reasons for line wiggling when working with small dimensions.

In step (a), a multilayer is provided comprising a porous low-k material 3. No hard mask 2 is provided on the porous low-k material 3 and a resist layer 1 is provided directly on the low-k material 3 by standard lithographic techniques.

In step (b), an opening is performed in the resist layer 1 by a standard lithographic technique (for instance involving fluorocarbons), thereby making accessible a surface of the porous material 3.

In step (c) the opened multilayer is transferred to a cryogenic chamber under a reduced pressure P1 and is positioned on a bearing (a chunk) having a temperature T1 lower than the temperature at which the fluid freezes under the pressure conditions of the chamber and the chamber is filled with the fluid, which penetrates the pores of the substrate and freezes within, thereby providing a filled substrate 4.

In step (d), the filled-in substrate 4 is then etched with a fluorine containing plasma 7 down to the appropriate depth.

The resist layer is stripped in situ in $O_2$ and $H_2$ plasma during a step (d*). The advantages are the same as for the embodiment of FIG. 4, i.e. avoiding damaging the porous substrate during the resist removal step and this advantage is achieved without the use of a hard mask.

In step (e), the plasma treatment is then stopped, the pressure is allowed to increase back to a pressure P2 (e.g. of 1 atm) and the temperature is allow to increase back to a temperature T2 (e.g. equal to room temperature).

The result of this exemplary embodiment is a patterned porous low-k substrate which is not damaged.

It is to be understood that although preferred embodiments, specific constructions and configurations, as well as materials, have been discussed herein for devices according to the present invention, various changes or modifications in form and detail may be made without departing from the scope and spirit of this invention. For example, any formulas given above are merely representative of procedures that may be used. Functionality may be added or deleted from the block diagrams and operations may be interchanged among functional blocks. Steps may be added or deleted to methods described within the scope of the present invention.

What is claimed is:

1. A method for treating a surface of a porous material in an environment, comprising:
   i. setting a temperature of a surface of a porous material to a value T1 and setting a pressure of an environment to a value P1;
   ii. contacting the surface with a fluid having a solidifying temperature at the pressure value P1 above the temperature value T1 and having a vaporizing temperature at the pressure value P1 below 80° C., thereby solidifying the fluid in pores of the material, thereby sealing the pores;
   iii. treating the surface by an etching of the surface or by a modification of the surface; and
   iv. setting the temperature of the surface to a value T2 and setting the pressure of the environment to a value P2 in such a way as to vaporize the fluid, whereby a treated porous material is obtained;
   wherein:
      the step i precedes the step ii, the step ii precedes the step iii, and the step iii precedes the step iv, or
      the step i precedes the step ii, the step ii overlaps or is simultaneous with the step iii, and the step iii precedes the step iv, or
      the step ii precedes the step i, the step i precedes the step iii, and the step iii precedes the step iv.

2. The method of claim 1, wherein the temperature value T2 is at least equal to the vaporization temperature of the fluid at the pressure value P1 and wherein the pressure value P2 is equal to the pressure value P1.

3. The method of claim 1, wherein the material has a dielectric constant lower than 3.9.

4. The method of claim 1, wherein the material has a dielectric constant lower than 3.5.

5. The method of claim 1, wherein the material has a dielectric constant lower than 3.0.

6. The method of claim 1, wherein the material has a dielectric constant lower than 2.4.

7. The method of claim 1, wherein the porous material is a nanoporous material.

8. The method of claim 1, wherein a porosity of the porous material is at least partly interconnected.

9. The method of claim 1, wherein a porosity of the porous material is fully interconnected.

10. The method of claim 1, wherein the material is a silicon-containing material or a porous organic polymer.

11. The method of claim 1, wherein the temperature value T1 is below 0° C.

12. The method of claim 1, wherein the temperature value T1 is below −5° C.

13. The method of claim 1, wherein treating the surface is plasma treating the surface.

14. The method of claim 1, wherein treating the surface is plasma etching the surface.

15. The method of claim 1, wherein the fluid is an organic fluid.

16. The method of claim 15, wherein the organic fluid has a melting point at 1 atm lower than 10° C.

17. The method of claim 1, wherein the step i is performed by placing the porous material in thermal contact with a bearing having a temperature at the value T1 in such a way that the surface faces away from the bearing.

18. The method of claim 1, wherein the temperature value T2 is from 15° C. to 80° C.

19. The method of claim 1, wherein treating the surface comprises etching the surface so as to form a recess, the method further comprising:
   v. filling, at least partially, the recess with a metal,
   wherein the step v is performed after the step iii and before or after the step iv.

20. The method of claim 1, further comprising, before the step i:
   vi. providing a porous material having a surface bearing a resist layer; and
   vii. patterning the resist layer so as to expose a surface of the porous material, thereby providing a surface of a porous material,
   wherein treating the surface comprises etching the surface, thereby forming a recess in the porous material.

21. The method of claim 1, wherein the porous material has trenches in a surface thereof, and wherein the porous material has a k-value lower than 2.5 at a level of the trenches.

22. The method of claim 1, wherein the porous material has trenches in a surface thereof, and wherein the porous material has a k-value lower than 2.3 at a level of the trenches.

* * * * *